United States Patent
Sawamura et al.

(10) Patent No.: US 11,588,460 B2
(45) Date of Patent: Feb. 21, 2023

(54) ELASTIC WAVE DEVICE MANUFACTURING METHOD, ELASTIC WAVE DEVICE, RADIO-FREQUENCY FRONT-END CIRCUIT, AND COMMUNICATION DEVICE

(71) Applicant: Murata Manufacturing Co., Ltd., Nagaokakyo (JP)

(72) Inventors: Makoto Sawamura, Nagaokakyo (JP); Seiji Kai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 916 days.

(21) Appl. No.: 16/446,798

(22) Filed: Jun. 20, 2019

(65) Prior Publication Data

US 2019/0312559 A1    Oct. 10, 2019

Related U.S. Application Data

(63) Continuation of application No. PCT/JP2017/041522, filed on Nov. 17, 2017.

(30) Foreign Application Priority Data

Dec. 21, 2016   (JP) .............................. JP2016-247718

(51) Int. Cl.
*H03H 3/08*      (2006.01)
*G10K 11/36*     (2006.01)
(Continued)

(52) U.S. Cl.
CPC ............... *H03H 3/08* (2013.01); *G10K 11/36* (2013.01); *H03H 9/02574* (2013.01); *H03H 9/25* (2013.01); *H03H 9/72* (2013.01)

(58) Field of Classification Search
CPC ........ H03H 3/08; H03H 9/02574; H03H 9/25; H03H 9/72; G10K 11/36
(Continued)

(56) References Cited

U.S. PATENT DOCUMENTS 10,284,176 B1 *   5/2019   Solal ................... H03H 9/6483
2009/0051245 A1    2/2009   Takayama et al.
(Continued)

FOREIGN PATENT DOCUMENTS

JP   2010-157956 A     7/2010
WO   2006/106831 A1   10/2006
(Continued)

OTHER PUBLICATIONS

Official Communication issued in International Patent Application No. PCT/JP2017/041522 dated Feb. 6, 2018.

*Primary Examiner* — Hafizur Rahman
(74) *Attorney, Agent, or Firm* — Keating & Bennett, LLP

(57) ABSTRACT

An elastic wave device manufacturing method includes a preparing a piezoelectric wafer on which IDT electrodes are provided in elastic wave device forming portions, providing on a first main surface of the piezoelectric wafer support layers in the elastic wave device forming portions, bonding a cover member to cover the support layers to obtain a multilayer body, cutting the multilayer body in a first direction multiple times, cutting the multilayer body in a second direction orthogonal to the first direction to obtain elastic wave devices, in which a resin layer extends across a boundary between the elastic wave device forming portions adjacent to each other on the first main surface of the piezoelectric wafer, and the second cutting step is performed in a state in which the resin layer is present.

19 Claims, 7 Drawing Sheets

(51) Int. Cl.
  *H03H 9/02*  (2006.01)
  *H03H 9/25*  (2006.01)
  *H03H 9/72*  (2006.01)
(58) Field of Classification Search
  USPC .......................................................... 310/311
  See application file for complete search history.

(56) References Cited

U.S. PATENT DOCUMENTS

| | | |
|---|---|---|
| 2010/0253182 A1 | 10/2010 | Takada et al. |
| 2016/0294354 A1 | 10/2016 | Saijo et al. |
| 2017/0033763 A1 | 2/2017 | Hira et al. |

FOREIGN PATENT DOCUMENTS

| | | |
|---|---|---|
| WO | 2009/078137 A1 | 6/2009 |
| WO | 2015/098679 A1 | 7/2015 |
| WO | 2015/159465 A1 | 10/2015 |

\* cited by examiner

ELASTIC WAVE DEVICE MANUFACTURING METHOD, ELASTIC WAVE DEVICE, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-247718 filed on Dec. 21, 2016 and is a Continuation Application of PCT Application No. PCT/JP2017/041522 filed on Nov. 17, 2017. The entire contents of each application are hereby incorporated herein by reference.

BACKGROUND OF THE INVENTION

1. Field of the Invention

The present invention relates to a method for manufacturing a plurality of elastic wave devices including a piezoelectric wafer, and also relates to elastic wave devices, radio-frequency front-end circuits, and communication devices.

2. Description of the Related Art

WO2009/078137 discloses a method for manufacturing a large number of surface acoustic wave devices using a piezoelectric wafer. In the manufacturing method described in WO2009/078137, in order to form a plurality of surface acoustic wave devices on the upper surface of a piezoelectric wafer, interdigital transducer (IDT) electrodes and terminal electrodes electrically connected to the IDT electrodes are provided in each surface acoustic wave device forming portion. Next, a support layer that surrounds the IDT electrodes is provided. Each support layer is made of a synthetic resin. Next, a cover member is laminated over the piezoelectric wafer so as to cover the plurality of support layers. Subsequently, a multilayer body, which includes the piezoelectric wafer, the support layers, and the cover member, is cut in a first direction with a dicing machine, and thereafter, the multilayer body is cut in a second direction orthogonal to the first direction with a dicing machine. Accordingly, the multilayer body is singulated, and a plurality of surface acoustic wave devices are obtained. The planar shape of each surface acoustic wave device is a rectangular shape.

With the manufacturing method described in WO2009/078137, in the case of cutting in the first direction and in the second direction with a dicing machine, the dicing blade comes into contact with the piezoelectric wafer in the corners of the individual surface acoustic wave devices. Therefore, breakage or chipping is likely to occur in the piezoelectric substrates of the individual surface acoustic wave devices, that is, in each piezoelectric substrate obtained by dividing the piezoelectric wafer, which is a problem.

SUMMARY OF THE INVENTION

Preferred embodiments of the present invention provide elastic wave device manufacturing methods, elastic wave devices, radio-frequency front-end circuits, and communication devices, in each of which breakage or chipping is less likely to occur in a piezoelectric substrate.

An elastic wave device manufacturing method according to a preferred embodiment of the present invention includes a step of providing a plurality of IDT electrodes corresponding to a plurality of elastic wave devices on a first main surface of a piezoelectric wafer, the piezoelectric wafer including the first main surface and a second main surface opposite to each other; a step of providing a plurality of support layers that respectively surround the plurality of IDT electrodes on the first main surface of the piezoelectric wafer; a step of bonding a cover member so as to cover the plurality of support layers to obtain a multilayer body; a first cutting step of cutting the multilayer body in a first direction a plurality of times; and a second cutting step of cutting the multilayer body in a second direction orthogonal or substantially orthogonal to the first direction after the first cutting step to obtain the individual elastic wave devices, in which in a portion in which the elastic wave devices adjacent to each other are present on the first main surface of the piezoelectric wafer, a resin layer extends across a boundary between the elastic wave devices adjacent to each other, and the second cutting step is performed in a state in which the resin layer is present.

In an elastic wave device manufacturing method according to a preferred embodiment of the present invention, the second cutting step is performed in a state in which the resin layer that extends over the elastic wave devices adjacent to each other in the first direction is present.

In an elastic wave device manufacturing method according to a preferred embodiment of the present invention, the support layers are made of a synthetic resin, and the resin layer is made of a synthetic resin identical to the synthetic resin of the support layers.

In an elastic wave device manufacturing method according to a preferred embodiment of the present invention, between the first main surface of the piezoelectric wafer and the support layers, a base layer made of a synthetic resin having an elasticity modulus lower than an elasticity modulus of the support layers is provided.

In an elastic wave device manufacturing method according to a preferred embodiment of the present invention, the base layer also extends between the first main surface of the piezoelectric wafer and the resin layer.

In an elastic wave device manufacturing method according to a preferred embodiment of the present invention, the first cutting step and the second cutting step are performed by cutting with a dicing machine.

In an elastic wave device manufacturing method according to a preferred embodiment of the present invention, the piezoelectric wafer is a piezoelectric substrate.

In an elastic wave device manufacturing method according to a preferred embodiment of the present invention, the piezoelectric wafer includes a support substrate, and a piezoelectric layer that is laminated on the support substrate.

In an elastic wave device manufacturing method according to a preferred embodiment of the present invention, through the support substrate, a bulk wave propagates at an acoustic velocity higher than an acoustic velocity of an elastic wave that propagates through the piezoelectric layer. In this case, the elastic wave is able to be effectively confined within the piezoelectric layer.

In an elastic wave device manufacturing method according to a preferred embodiment of the present invention, each of the elastic wave devices further includes a low-acoustic-velocity material layer that is laminated between the support substrate and the piezoelectric layer and that is made of a low-acoustic-velocity material through which a bulk wave propagates at an acoustic velocity lower than the acoustic velocity of an elastic wave that propagates through the piezoelectric layer. In this case, the elastic wave is able to be more effectively confined within the piezoelectric layer.

In an elastic wave device manufacturing method according to a preferred embodiment of the present invention, each of the elastic wave devices further includes a high-acoustic-velocity material layer that is laminated between the support substrate and the piezoelectric layer and that is made of a high-acoustic-velocity material through which a bulk wave propagates at an acoustic velocity higher than an acoustic velocity of an elastic wave that propagates through the piezoelectric layer; and a low-acoustic-velocity material layer that is laminated between the high-acoustic-velocity material layer and the piezoelectric layer and that is made of a low-acoustic-velocity material through which a bulk wave propagates at an acoustic velocity lower than the acoustic velocity of an elastic wave that propagates through the piezoelectric layer.

An elastic wave device according to a preferred embodiment of the present invention includes a piezoelectric substrate that includes a first main surface and a second main surface opposite to each other and has piezoelectricity in at least a portion thereof; an IDT electrode that is provided on the first main surface of the piezoelectric substrate; a support layer that is provided on the first main surface of the piezoelectric substrate so as to surround the IDT electrode; and a cover member that covers the support layer, in which the support layer is located inward from an outer edge of the first main surface of the piezoelectric substrate, and a resin layer that extends to at least one of a plurality of corner portions of the first main surface of the piezoelectric substrate is provided.

In an elastic wave device according to a preferred embodiment of the present invention, the resin layer is connected to the support layer.

In an elastic wave device according to a preferred embodiment of the present invention, the support layer is made of a synthetic resin, and the resin layer is made of a synthetic resin identical to the synthetic resin of the support layer.

In an elastic wave device according to a preferred embodiment of the present invention, between the first main surface of the piezoelectric substrate and the support layer, a base layer made of a resin having an elasticity modulus lower than an elasticity modulus of the support layer is provided.

In an elastic wave device according to a preferred embodiment of the present invention, the base layer also extends between the first main surface of the piezoelectric substrate and the resin layer.

In an elastic wave device according to a preferred embodiment of the present invention, the piezoelectric substrate includes a support substrate, and a piezoelectric layer that is laminated on the support substrate.

In an elastic wave device according to a preferred embodiment of the present invention, through the support substrate, a bulk wave propagates at an acoustic velocity higher than an acoustic velocity of an elastic wave that propagates through the piezoelectric layer.

In an elastic wave device according to a preferred embodiment of the present invention, the elastic wave device further includes a low-acoustic-velocity material layer that is laminated between the support substrate and the piezoelectric layer and that is made of a low-acoustic-velocity material through which a bulk wave propagates at an acoustic velocity lower than the acoustic velocity of an elastic wave that propagates through the piezoelectric layer.

In an elastic wave device according to a preferred embodiment of the present invention, the elastic wave device further includes a high-acoustic-velocity material layer that is laminated between the support substrate and the piezoelectric layer and that is made of a high-acoustic-velocity material through which a bulk wave propagates at an acoustic velocity higher than an acoustic velocity of an elastic wave that propagates through the piezoelectric layer; and a low-acoustic-velocity material layer that is laminated between the high-acoustic-velocity material layer and the piezoelectric layer and that is made of a low-acoustic-velocity material through which a bulk wave propagates at an acoustic velocity lower than the acoustic velocity of an elastic wave that propagates through the piezoelectric layer.

A radio-frequency front-end circuit according to a preferred embodiment of the present invention includes an elastic wave device according to a preferred embodiment of the present invention; and a power amplifier.

A communication device according to a preferred embodiment of the present invention includes a radio-frequency front-end circuit according to a preferred embodiment of the present invention; and an RF signal processing circuit.

According to preferred embodiments of the present invention, it is possible to provide elastic wave device manufacturing methods, elastic wave devices, radio-frequency front-end circuits, and communication devices in which breakage or chipping is less likely to occur in a piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described below with reference to the drawings.

The preferred embodiments described herein are illustrative, and it should be noted that configurations in different preferred embodiments may be partially replaced or combined with one another.

With reference to FIG. 1 to FIG. 5, an elastic wave device manufacturing method according to a first preferred embodiment of the present invention will be described.

First, in order to form a plurality of elastic wave devices, a piezoelectric wafer including a first main surface and a second main surface opposite to each other is prepared. Next, on the first main surface of the piezoelectric wafer, a plurality of IDT electrodes each corresponding to an IDT electrode of a corresponding one of the plurality of elastic wave devices are provided.

Next, on the first main surface of the piezoelectric wafer, a support layer that surrounds each IDT electrode of a corresponding one of the elastic wave devices is provided in a corresponding elastic wave device forming portion.

Next, a cover member is bonded so as to cover the plurality of support layers to obtain a multilayer body.

Figure 1:
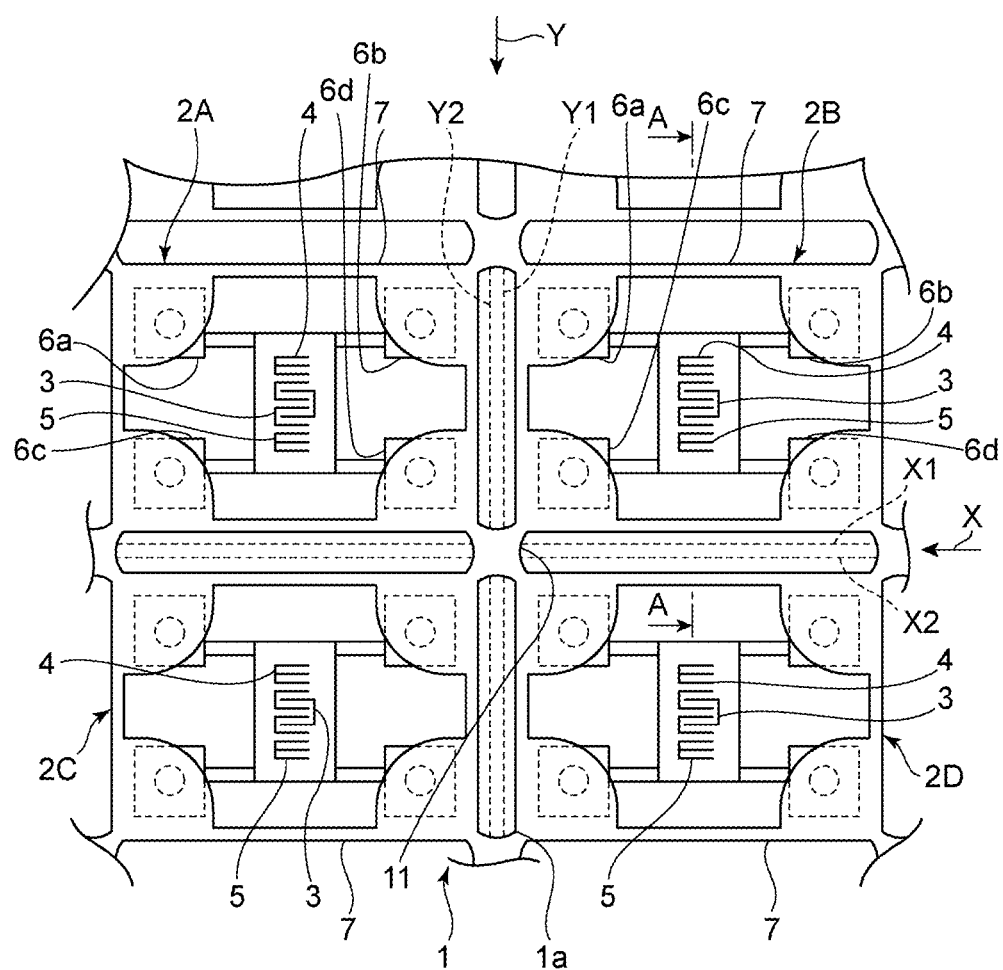
FIG. 1 is a partially cut-away schematic plan view for describing an elastic wave device manufacturing method according to a first preferred embodiment of the present invention.
Figure 2:
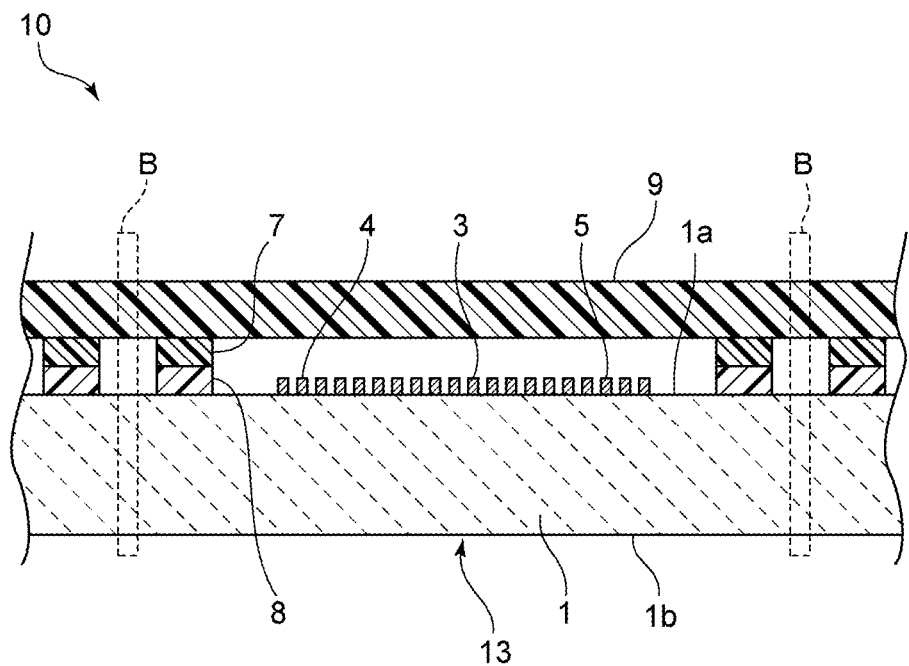
FIG. 2 is a partially cut-away lateral cross-sectional view of a portion of a multilayer body taken along line A-A in FIG. 1.

FIG. 1 is a partially cut-away schematic plan view of a structure of the multilayer body thus obtained in a state in which the cover member is removed from the multilayer body. FIG. 2 is a partially cut-away lateral cross-sectional view of a portion of the multilayer body taken along line A-A in FIG. 1. FIG. 2 illustrates a portion of the multilayer body in a state in which the cover member is bonded.

FIG. 1 illustrates a portion in which four elastic wave device forming portions 2A to 2D are provided on a first main surface 1a of a piezoelectric wafer 1.

In each of the elastic wave device forming portions 2A to 2D, an IDT electrode 3 is provided. A reflector 4 is provided on one side of the IDT electrode 3 in an elastic wave propagation direction, and a reflector 5 is provided on the other side thereof in the elastic wave propagation direction. In each of the elastic wave device forming portions 2A to 2D, a one-port elastic wave resonator is preferably formed. Note that, in the present preferred embodiment, the electrode structure in each elastic wave device forming portion is not limited to this. An elastic wave filter device, such as a longitudinally coupled resonator elastic wave filter or a ladder filter, may be formed.

As the piezoelectric wafer 1, a piezoelectric single crystal substrate preferably made of, for example, $LiNbO_3$ or $LiTaO_3$ is used in the present preferred embodiment.

A functional electrode portion that defines an elastic wave device including the IDT electrode 3 is electrically connected to terminal electrodes 6a to 6d.

The IDT electrode 3, the reflectors 4 and 5, and the terminal electrodes 6a to 6d are preferably made of a suitable metal or alloy, such as Al, an AlCu alloy, Pt, or W, for example. As the material of the electrodes, a multilayer metal film including a plurality of metal films that are laminated may be used.

A support layer 7 preferably made of, for example, a synthetic resin surrounds a portion in which the IDT electrode 3 is provided.

The material used to make the support layer 7 is not specifically limited and, for example, a polyimide resin, such as a photosensitive polyimide or a thermosetting polyimide, or an epoxy resin may preferably be used.

The support layer 7 preferably has, for example, a rectangular or substantially rectangular frame shape in each of the elastic wave device forming portions 2A to 2D.

In the present preferred embodiment, as illustrated in FIG. 2, a base layer 8 is provided between the support layer 7 and the first main surface 1a of the piezoelectric wafer 1. The base layer 8 is preferably made of, for example, a synthetic resin having an elasticity modulus lower than that of the support layer 7. However, the base layer 8 may be made of any other material as long as the elasticity modulus thereof is lower than that of the support layer 7.

In manufacturing, the electrode structure including the IDT electrode 3 is provided, and thereafter, the base layer 8 is formed. To form the base layer 8, a mask including an opening in a portion in which the base layer 8 and the support layer 7 are provided is used, and coating with a synthetic resin material that forms the base layer 8 is performed. Subsequently, the synthetic resin that forms the base layer 8 is set. In a case in which a synthetic resin that sets when irradiated with ultraviolet rays is used as the material of the base layer 8, the synthetic resin is irradiated with ultraviolet rays so as to set. In a case in which a thermosetting resin is used, the resin needs to be heated so as to set.

Next, the same mask is used, and coating with a synthetic resin material that forms the support layer 7 is performed. Subsequently, the support layer 7 is irradiated with ultraviolet rays or is heated so as to set in the same or similar manner to the base layer 8. Accordingly, the base layer 8 and the support layer 7 are formed. In the present preferred embodiment, the base layer 8 and the support layer 7 preferably have, for example, a rectangular or substantially rectangular frame shape.

In FIG. 1, in a portion in which the elastic wave device forming portions 2A to 2D join, a resin layer 11 is provided so as to be connected to the support layers 7. The resin layer 11 is provided in an integrated manner and is made of a resin the same or substantially the same as the resin of the support layers 7. The resin layer 11 provided so as to be integrated with the support layers 7 is not only provided in the portion in which the elastic wave device forming portions 2A to 2D join but also extends to a portion that corresponds to a corner portion of each of the elastic wave devices obtained as a result of singulation in plan view. The planar shape of each elastic wave device obtained as a result of singulation is preferably a rectangular or substantially rectangular shape, and therefore, a corner of the rectangular or substantially rectangular shape corresponds to the corner portion. Note that, in the present preferred embodiment, as the base of the resin layer 11, a base layer made of a material the same or substantially the same as that of the base layer 8 is also provided.

In actual manufacturing, when the base layer 8 and the support layer 7 are formed, the base layer portion that defines and functions as the base of the resin layer 11 and the resin layer 11 are simultaneously formed. Therefore, as the above-described mask that is used to form the support layer 7, a mask also including an opening in a portion in which the resin layer 11 is provided, in addition to the portion in which the support layer 7 is provided is used.

Next, as illustrated in FIG. 2, a cover member 9 is laminated on the support layers 7. The cover member 9 is preferably made of, for example, a synthetic resin, such as a polyimide or an epoxy resin. With the cover member 9, each portion surrounded by a corresponding one of the support layers 7 is sealed. Accordingly, a multilayer body 10 illustrated in FIG. 2 is obtained.

In FIG. 1, a direction indicated by the arrow X is denoted as a first direction, and a direction indicated by the arrow Y is denoted as a second direction. The first direction X and the second direction Y are orthogonal or substantially orthogonal to each other.

Next, in a first cutting step, the multilayer body 10 is cut in the first direction X using a dicing blade. In this case, for example, the dicing blade moves to pass through a portion between the elastic wave device forming portion 2B and the elastic wave device forming portion 2D and reaches a portion between the elastic wave device forming portion 2A and the elastic wave device forming portion 2C. An area between the dashed line X1 and the dashed line X2 in FIG. 1 corresponds to a portion that is removed by cutting with the dicing blade. Therefore, the dashed line X1 corresponds to the position of an edge of the piezoelectric substrate of an elastic wave device obtained in the elastic wave device forming portion 2B. The dashed line X2 corresponds to the position of an edge of the piezoelectric substrate of an elastic wave device obtained in the elastic wave device forming portion 2D. The dicing blade moves toward the side of the resin layer 11 while removing the area sandwiched between the dashed lines X1 and X2 by cutting.

Figure 3:
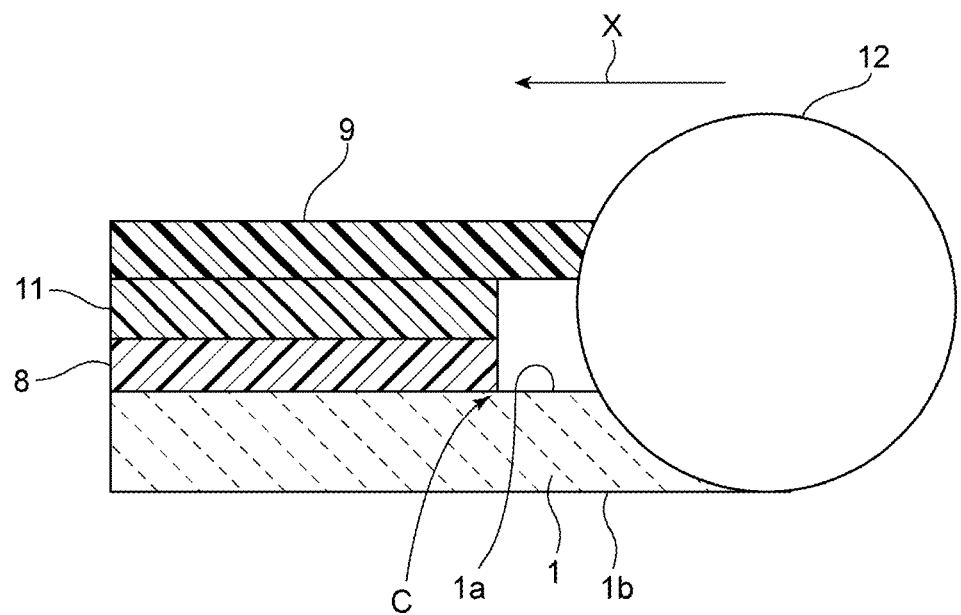
FIG. 3 is a partially enlarged elevational cross-sectional view for describing a step of cutting with a dicing blade in the elastic wave device manufacturing method according to the first preferred embodiment of the present invention.

FIG. 3 is a partially enlarged elevational cross-sectional view for describing the first cutting step of cutting in the first direction X with a dicing blade 12. The dicing blade 12 is moved in the first direction X while being rotated. As a result, the piezoelectric wafer 1 and the cover member 9 are partially removed by cutting. That is, on the near side of the resin layer 11, a portion in which the cover member 9 is located over the piezoelectric wafer 1 is cut. When the dicing blade 12 reaches the portion in which the resin layer 11 is present in FIG. 1, the multilayer body in which the piezoelectric wafer 1, the base layer 8, the resin layer 11, and the cover member 9 are laminated is cut with the dicing blade 12. Beyond the portion in which the resin layer 11 is provided, in the area between the elastic wave device forming portion 2A and the elastic wave device forming portion 2C in FIG. 1, cutting of a portion in which the piezoelectric wafer 1 and the cover member 9 are opposed to each other with a space therebetween is further performed, as illustrated in FIG. 3. When the dicing blade 12 reaches the resin layer 11 in the vicinity of the end portion on the opposite side, a portion in which the piezoelectric wafer 1, the base layer 8, the resin layer 11, and the cover member 9 are laminated is removed by cutting.

On the piezoelectric wafer 1, a large number of elastic wave device forming portions are arranged in a matrix. Therefore, the first cutting step in the first direction X is performed a plurality of times.

In this case, in the portion in which the elastic wave device forming portions 2A to 2D join, the base layer 8 and the resin layer 11 are laminated. Therefore, in a portion indicated by the arrow C in FIG. 3, large stress is less likely to be applied.

Next, a second cutting step is performed in the second direction Y with a dicing blade. In the second cutting step, an area sandwiched between the dashed line Y1 and Y2 in FIG. 1 is cut and removed with the dicing blade.

Also in the second cutting step, as in the first cutting step, in an area sandwiched between the support layers 7 adjacent to each other, the cover member 9 is laminated over the first main surface 1a of the piezoelectric wafer 1 with a gap therebetween. In the second cutting step, as in the case of the first cutting step, in an area in which the resin layer 11 is not formed and the support layers 7 of the elastic wave device forming portions 2A and 2B adjacent to each other are opposed to each other, only the synthetic resin of the cover member 9 is cut. If a large amount of synthetic resin is continuously cut with a dicing blade, the dicing blade is clogged up with resin debris left after cutting, and a defect, such as chipping, is highly likely to occur. However, in the second cutting step, the portion right under the cover member 9 is the gap as described above and no synthetic resin is present. Therefore, a defect caused by clogging up with synthetic resin debris left after cutting is able to be reduced or prevented.

Figure 4:
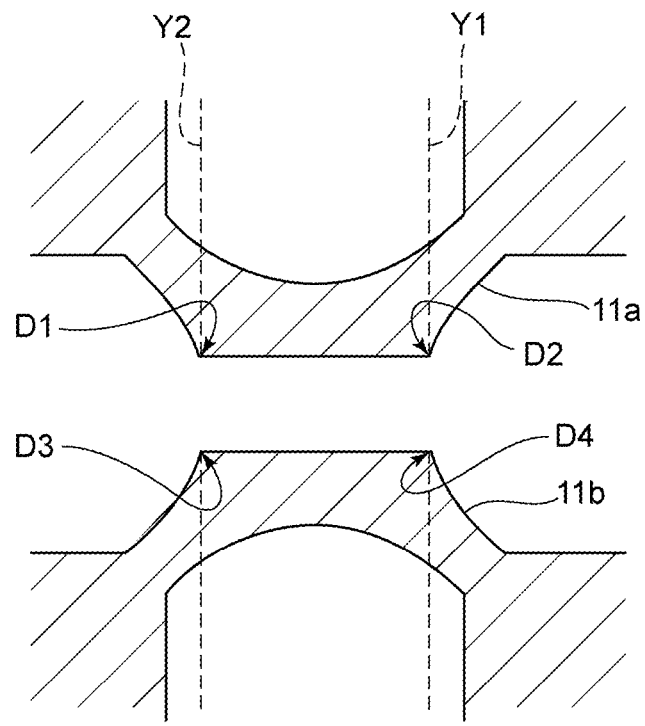
FIG. 4 is a partially enlarged plan view of a portion in which a resin layer is provided over a first main surface of a piezoelectric wafer in the first preferred embodiment of the present invention.

When the dicing blade approaches a portion in which a resin layer 11a illustrated in FIG. 4, which is left after the first cutting step, is provided, in a portion in which the base layer 8 and the resin layer 11a are laminated, the multilayer body formed of the piezoelectric wafer 1, the base layer 8, the resin layer 11a, and the cover member 9 are cut. That is, the portion sandwiched between the dashed line Y1 and the dashed line Y2 is removed by cutting. Such cutting in the second direction Y is performed a plurality of times. Accordingly, the multilayer body 10 is singulated, and individual elastic wave devices are obtained. Therefore, a portion sandwiched between portions that are indicated by the dashed lines B in FIG. 2 and that are removed by cutting with a dicing blade corresponds to an elastic wave device 13 according to the present preferred embodiment. Note that the second cutting step may be performed only once.

In a case in which the first cutting step is performed in the first direction X and the second cutting step is subsequently performed in the second direction Y, workpieces that are cut in the second cutting step are smaller than workpieces that are cut in the first cutting step. Therefore, in the second cutting step, the workpieces become less stable, and chipping is more likely to occur.

However, in the present preferred embodiment, such a problem of chipping is overcome, which will be described below.

As illustrated in FIG. 4, in the portion in which the four elastic wave device forming portions 2A to 2D join, a synthetic resin, such as the resin layer 11a and a resin layer 11b, is formed over the piezoelectric wafer 1, and a dicing blade comes into contact with the resin layers 11a and 11b. Therefore, in the second cutting step, large stress is less likely to be applied to the piezoelectric wafer 1. This is because the resin layer 11a is provided between the elastic wave device forming portion 2A that is located on one side of the portion sandwiched between the dashed lines Y1 and Y2 and the elastic wave device forming portion 2B located on the other side thereof so as to extend over the elastic wave device forming portions 2A and 2B. Therefore, vibrations transmitted from the dicing blade are able to be dispersed to the elastic wave device forming portions 2A and 2B on the respective ends. Further, as described above, the dicing blade comes into contact with the piezoelectric wafer 1 via the resin layer 11a. Therefore, runout in the dicing blade is able to be reduced or prevented, resulting in a reduced likelihood of chipping. When the resin layer 11 is formed in the above-described position, chipping in the elastic wave device forming portions 2A and 2B on the respective ends is able to be reduced or prevented in the second cutting step.

Similarly, the resin layer 11b is provided between the elastic wave device forming portion 2C and the elastic wave device forming portion 2D so as to extend over the elastic wave device forming portions 2C and 2D.

Therefore, in the second cutting step, even if cutting is performed, the positions of the elastic wave device forming portions on the respective sides of the dashed lines Y1 and Y2 are maintained stable in the portions in which the resin layers 11a and 11b are provided. In addition, not the portion in which the cover member 9 is laminated over the piezoelectric wafer 1 with a space therebetween, but the portion in which the base layer 8 and the resin layer 11a or 11b are laminated is cut. Therefore, large stress is less likely to be applied to the piezoelectric wafer 1 at the time of cutting as in the above-described case. Further, chipping is able to be reduced or prevented. Accordingly, the piezoelectric wafer 1 is able to be singulated with a high accuracy in the second cutting step.

As described above, in corner portions indicated by the arrows D1 to D4 in FIG. 4, breakage or chipping is less likely to occur. The corner portions indicated by the arrows D1 to D4 correspond to the corner portions of the respective piezoelectric substrates of the elastic wave devices.

In order to obtain the surface acoustic wave device described in WO2009/078137, a portion in which the cover member is laminated over the piezoelectric wafer with a space therebetween is cut with a dicing machine. Therefore, if cutting is repeatedly performed in the first direction and the second direction in a portion in which four elastic wave device forming portions join, chipping or breakage may occur in the corner portions of the piezoelectric substrates of the finally obtained elastic wave devices. This is because of the space between the piezoelectric wafer and the cover member and the dicing blade directly comes into collision with the piezoelectric wafer to perform cutting.

On the other hand, in the manufacturing method according to the present preferred embodiment, in the corner portions of the piezoelectric substrates of the respective elastic wave devices in which large stress tends to be generated during singulation, the base layer 8 and the resin layer 11 are laminated, and therefore, stress that is applied to the piezoelectric wafer 1 decreases. Accordingly, breakage or chipping is less likely to occur in the corner portions of the piezoelectric substrates of the finally obtained elastic wave devices.

Figure 5:
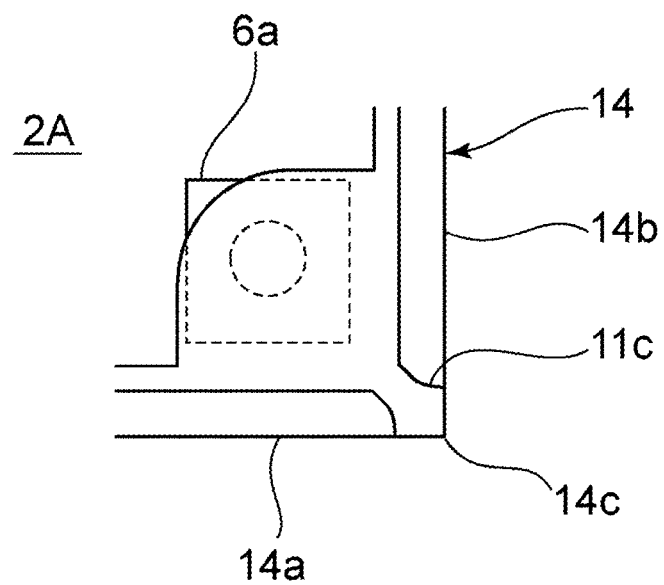
FIG. 5 is a partially enlarged plan view of a portion around a corner portion of a piezoelectric substrate obtained as a result of singulation in the manufacturing method according to the first preferred embodiment of the present invention.

FIG. 5 is a partially enlarged plan view of a portion around a corner portion of a piezoelectric substrate obtained as a result of singulation in the manufacturing method according to the present preferred embodiment. FIG. 5 illustrates a portion including a corner portion 14c of a piezoelectric substrate 14 of the elastic wave device forming portion 2A illustrated in FIG. 1. In the corner portion 14c, breakage or chipping described above is less likely to occur.

Note that, in FIG. 5, an edge 14a is a portion formed in the first cutting step, and an edge 14b is a portion formed in the second cutting step. Therefore, a resin layer 11c remains so as to extend to the corner portion 14c, as illustrated in FIG. 5. The resin layer 11c is a portion that remains after the first cutting step and the second cutting step described above. Also under the resin layer 11c, the base layer 8 described above is present.

Note that, in the first cutting step and the second cutting step, the piezoelectric wafer 1 is completely cut. In this case, it is preferable to, for example, adhere the multilayer body including the piezoelectric wafer 1 on a cutting stage with an adhesive sheet. Accordingly, even if the piezoelectric wafer 1 is completely cut in the first and second cutting steps, the position of the multilayer body and the positions of the elastic wave devices obtained as a result of singulation are less likely to vary during cutting.

If the positions of the workpieces vary in the process of singulation, chipping may occur or the shapes of the pieces obtained as a result of singulation may vary. Accordingly, the yield may decrease. In the present preferred embodiment, cutting is performed in a state in which the resin layer 11 is provided, and therefore, the first and second cutting steps are able to be stably performed.

However, in the first and second cutting steps, the piezoelectric wafer 1 need not be divided by complete cutting. For example, the piezoelectric wafer 1 may be subjected to half-cutting from the side of the first main surface 1a so that the cutting does not reach a second main surface 1b. In this case, the multilayer body may be divided after the first cutting step and after the second cutting step, or after the first and second cutting steps.

Note that, in the present preferred embodiment, the resin layer 11 and the support layers 7 are provided in an integrated manner and made of the same material. However, the resin layer 11 may be made of a resin material different from that of the support layers 7. The resin layer 11 need not be formed simultaneously with the support layers 7. However, it is preferable to form the resin layer 11 and the support layers 7 simultaneously using the same material as in the present preferred embodiment. Accordingly, the types of materials are able to be reduced, and the manufacturing process are able to be simplified.

Further, the base layer 8 need not be provided. That is, the resin layer 11 may be provided directly on the first main surface 1a of the piezoelectric wafer 1 without the base layer 8.

However, in a case in which the elasticity modulus of the base layer 8 is lower than that of the resin layer 11, stress that is applied to the first main surface 1a of the piezoelectric wafer 1 at the time of cutting is able to be more effectively reduced.

Figure 6:
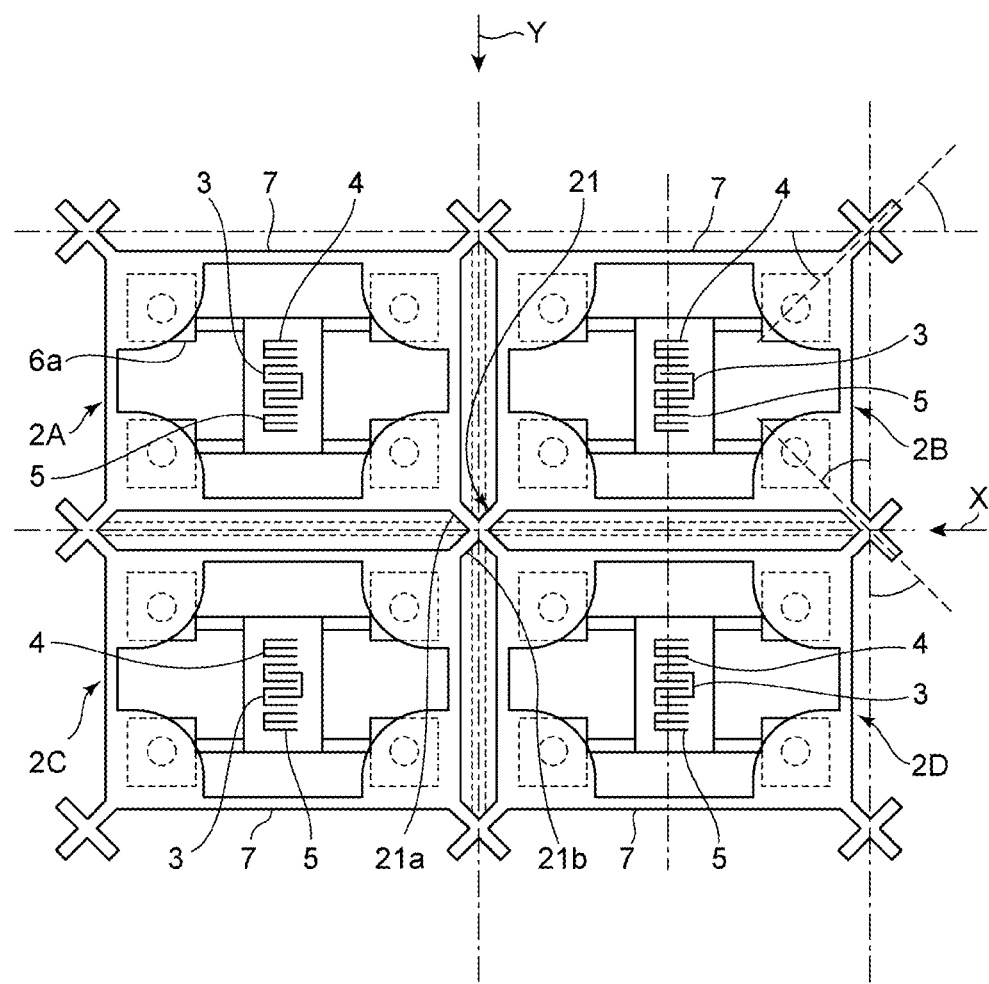
FIG. 6 is a plan view for describing an elastic wave device manufacturing method according to a second preferred embodiment of the present invention.
Figure 7:
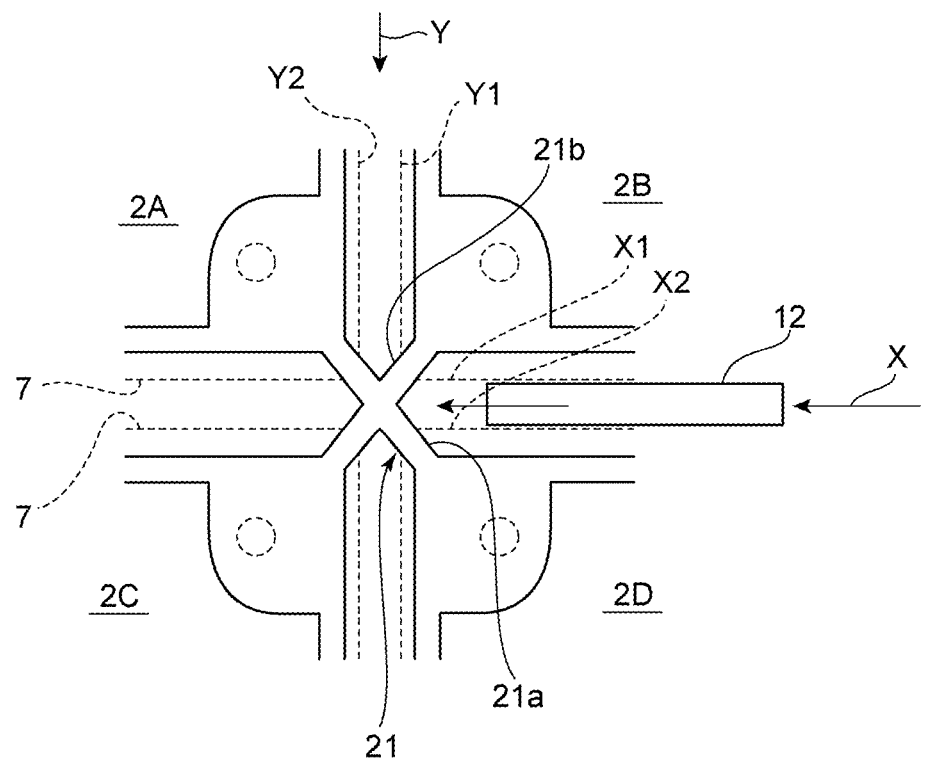
FIG. 7 is a partially enlarged plan view for describing the elastic wave device manufacturing method according to the second preferred embodiment of the present invention.

The planar shape of the resin layer 11 is not limited to the shape of the resin layer 11 in the first preferred embodiment. A manufacturing method according to a second preferred embodiment of the present invention will be described with reference to FIG. 6 and FIG. 7. In the second preferred embodiment, a resin layer 21 is provided so as to be integrated with the support layers 7. The planar shape of the resin layer 21 is preferably a shape of the letter X, for example. That is, a first portion 21a having a linear shape and a second portion 21b having a linear shape are provided so as to be orthogonal or substantially orthogonal to each other. Preferably, for example, the first portion 21a is inclined at an angle of about 45° relative to the first direction X, and the second portion 21b is inclined at an angle of 45° relative to the second direction Y. Also in this case, as illustrated in FIG. 6, when, for example, a dicing blade is moved in the first direction X, in the portion in which the four elastic wave device forming portions 2A to 2D join, the resin layer 21 and a cover member not illustrated are laminated over the piezoelectric wafer 1, and therefore, breakage or chipping is less likely to occur in the corner portions of the piezoelectric substrates finally obtained as a result of singulation.

Note that, in the second preferred embodiment, the first portion 21a is inclined at an angle of about 45° relative to the first direction X, and the second portion 21b is inclined at an angle of about 45° relative to the second direction Y. However, the first portion 21a and the second portion 21b may be inclined at an angle other than about 45°.

Figure 8:
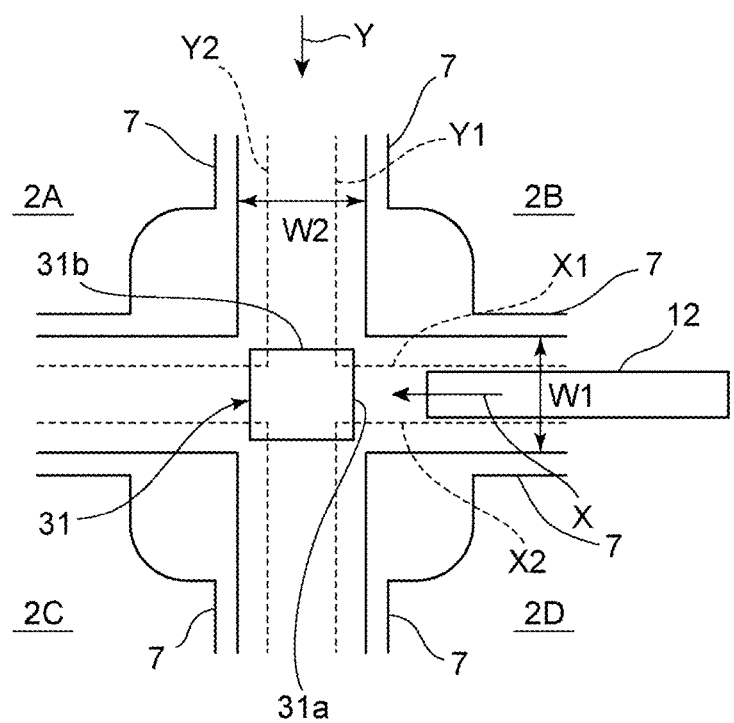
FIG. 8 is a partially enlarged plan view for describing an elastic wave device manufacturing method according to a third preferred embodiment of the present invention.

FIG. 8 is a partially enlarged plan view for describing a manufacturing method according to a third preferred embodiment of the present invention. In the third preferred embodiment, in the portion in which the four elastic wave device forming portions 2A to 2D join, a resin layer 31 preferably having, for example, a rectangular or substantially rectangular planar shape is provided. As described above, the resin layer 31 having a rectangular or substantially rectangular planar shape may be provided in a portion in which four elastic wave device forming portions join. As illustrated in FIG. 8, the length of a side 31a of the resin layer 31 that extends in the second direction Y is smaller than the width W1 of a portion in which the support layer 7 of the elastic wave device forming portion 2B and the support layer 7 of the elastic wave device forming portion 2D are opposed to each other. Further, the length of a side 31b that extends in the first direction X is smaller than the width W2 of a portion in which the support layer 7 of the elastic wave device forming portion 2A and the support layer 7 of the elastic wave device forming portion 2B are opposed to each other. However, the lengths of the sides 31a and 31b may be equal or substantially equal to the widths W1 and W2 respectively. In any case, the lengths of the sides 31a and 31b are preferably larger than the width of a portion that is cut and removed with the dicing blade 12.

Figure 9:
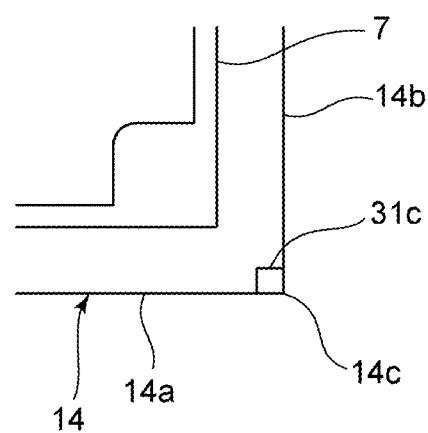
FIG. 9 is a partially enlarged plan view of a portion around a corner portion of a piezoelectric substrate in an elastic wave device obtained in the third preferred embodiment of the present invention.

FIG. 9 is a partially enlarged plan view of a portion around a corner portion of a piezoelectric substrate obtained as a result of singulation. In the present preferred embodiment, the resin layer 31 is partially removed by cutting, and a rectangular or substantially rectangular resin layer 31c remains in the corner portion 14c of the piezoelectric substrate 14 obtained as a result of singulation.

Figure 10:
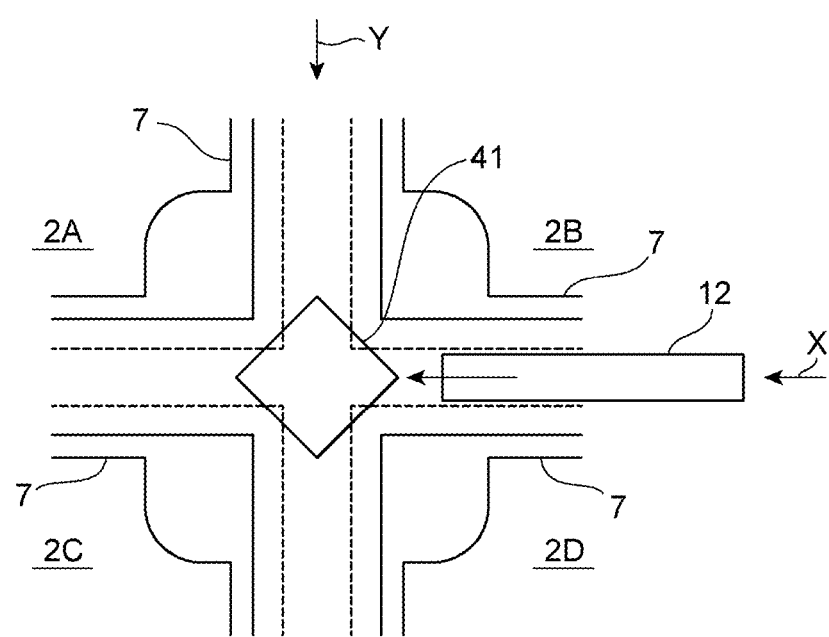
FIG. 10 is a partially enlarged plan view for describing an elastic wave device manufacturing method according to a fourth preferred embodiment of the present invention.
Figure 11:
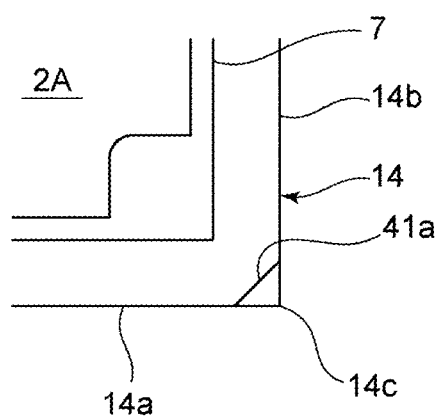
FIG. 11 is a partially enlarged plan view for describing a resin layer provided in a corner portion of a piezoelectric substrate in an elastic wave device obtained in the fourth preferred embodiment of the present invention.

FIG. 10 is a partially enlarged plan view of a portion including a resin layer 41 that is provided in a manufacturing method according to a fourth preferred embodiment of the present invention. In the present preferred embodiment, the resin layer 41 preferably having a rhombus planar shape is provided. Therefore, as a result of singulation performed in the first cutting step and the second cutting step, a resin layer 41a having a triangular or substantially triangular planar shape remains in the corner portion 14c, as illustrated in FIG. 11.

As is apparent from the second to fourth preferred embodiments described above, the planar shapes of the resin layers 21, 31, and 41 are not specifically limited. Therefore, other shapes, such as a circle shape and an ellipse shape, may be used. In any case, a resin layer needs to be provided over the piezoelectric wafer 1 so that the resin layer remains in portions corresponding to the corner portions of piezoelectric substrates obtained as a result of singulation.

Note that, in the first preferred embodiment, the piezoelectric wafer 1 is made of a piezoelectric single crystal substrate. However, the piezoelectric wafer may have a structure in which piezoelectric thin films are laminated on a support substrate. That is, a multilayer substrate that has piezoelectricity in at least a portion thereof may be used as the piezoelectric substrate.

Figure 12:
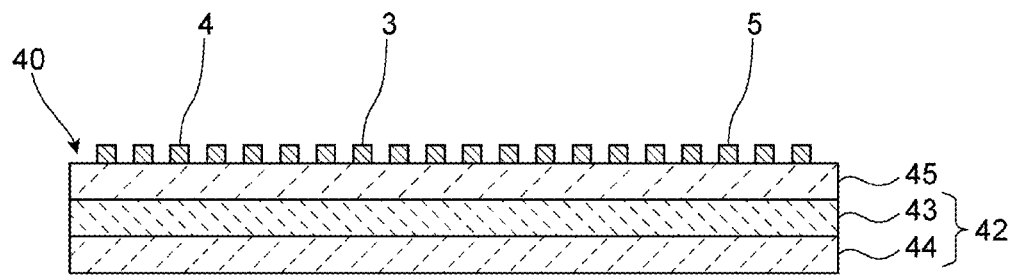
FIG. 12 is an elevational cross-sectional view for describing a piezoelectric wafer that is used in an elastic wave device according to a modification of a preferred embodiment of the present invention.

FIG. 12 is an elevational cross-sectional view for describing a piezoelectric wafer that is used in a modification of an elastic wave device according to a preferred embodiment of the present invention. A piezoelectric wafer 40 includes a support substrate 42 and a piezoelectric thin film 45 that is laminated on the support substrate 42 and that defines and functions as a piezoelectric layer. The support substrate 42 has a structure in which a low-acoustic-velocity material layer 43 is laminated on a high-acoustic-velocity material layer 44. The high-acoustic-velocity material layer 44 is made of a high-acoustic-velocity material through which a bulk wave propagates at an acoustic velocity higher than the acoustic velocity of an elastic wave that propagates through the piezoelectric thin film 45. The low-acoustic-velocity material layer 43 is made of a low-acoustic-velocity material through which a bulk wave propagates at an acoustic velocity lower than the acoustic velocity of an elastic wave that propagates through the piezoelectric thin film 45. When the low-acoustic-velocity material layer 43 and the high-acoustic-velocity material layer 44 are used, the elastic wave is able to be effectively confined within the piezoelectric thin film 45.

A high-acoustic-velocity material layer and a low-acoustic-velocity material layer may be laminated on the support substrate separately from the support substrate. That is, a high-acoustic-velocity material layer may be laminated between the support substrate and the piezoelectric thin film defining the piezoelectric layer, and a low-acoustic-velocity material layer may be laminated between the high-acoustic-velocity material layer and the piezoelectric layer. Alternatively, the support substrate may be made of a high-acoustic-velocity material as described above, and the piezoelectric thin film may be laminated on the support substrate. In this case, a low-acoustic-velocity material layer may be laminated between the support substrate and the piezoelectric thin film.

Elastic wave devices according to preferred embodiments of the present invention may be used as, for example, a duplexer of a radio-frequency front-end circuit. This example will be described below.

Figure 13:
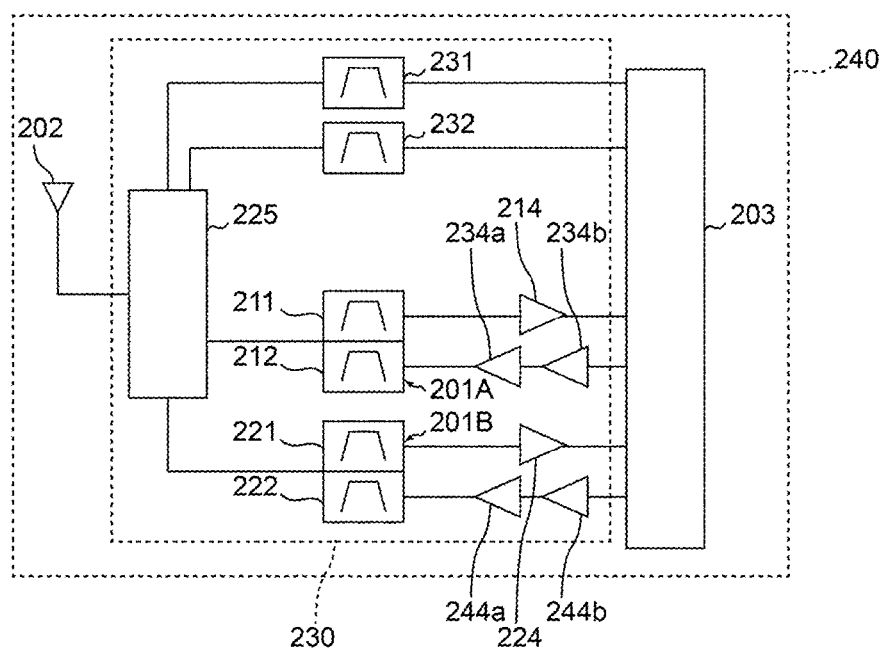
FIG. 13 is a diagram illustrating a configuration of a communication device and a radio-frequency front-end circuit according to preferred embodiments of the present invention.

FIG. 13 is a diagram illustrating a configuration of a communication device and a radio-frequency front-end circuit according to additional preferred embodiments of the present invention. In FIG. 13, elements connected to a radio-frequency front-end circuit 230, such as an antenna element 202 and an RF signal processing circuit (RFIC) 203, for example, are also illustrated. The radio-frequency front-end circuit 230 and the RF signal processing circuit 203 define a communication device 240. Note that the communication device 240 may include a power supply, a CPU, and a display, for example.

The radio-frequency front-end circuit 230 includes a switch 225, duplexers 201A and 201B, filters 231 and 232, low-noise amplifier circuits 214 and 224, and power amplifier circuits 234a, 234b, 244a, and 244b. Note that the radio-frequency front-end circuit 230 and the communication device 240 illustrated in FIG. 13 are examples of the radio-frequency front-end circuit and the communication device, and the configuration is not limited thereto.

The duplexer 201A includes filters 211 and 212. The duplexer 201B includes filters 221 and 222. The duplexers 201A and 201B are connected to the antenna element 202 with the switch 225 interposed between the antenna element 202 and the duplexers 201A and 201B. Note that the elastic wave devices according to the preferred embodiments described above may be used as the duplexers 201A and 201B or the filters 211, 212, 221, and 222.

Further, the elastic wave devices according to the preferred embodiments described above are applicable also to a multiplexer including three or more filters, such as a triplexer in which an antenna terminal is used in common by three filters or a hexaplexer in which an antenna terminal is used in common by six filters, for example.

That is, the elastic wave devices according to the preferred embodiments described above may be used as an elastic wave resonator, a filter, a duplexer, and a multiplexer including three or more filters, for example. The configuration of the multiplexer is not limited to a configuration in which both transmission filters and reception filters are included and may be a configuration in which only transmission filters or only reception filters are included.

The switch 225 connects the antenna element 202 with a signal path that corresponds to a predetermined band in accordance with a control signal from a controller (not illustrated), and is preferably, for example, an SPDT (single pole double throw) switch. Note that the number of signal paths that are connected to the antenna element 202 is not limited to one and may be two or more. That is, the radio-frequency front-end circuit 230 may handle carrier aggregation.

The low-noise amplifier circuit 214 is a reception amplifier circuit that amplifies a radio-frequency signal (here, a radio-frequency reception signal) that has passed through the antenna element 202, the switch 225, and the duplexer 201A, and outputs the amplified signal to the RF signal processing circuit 203. The low-noise amplifier circuit 224 is a reception amplifier circuit that amplifies a radio-frequency signal (here, a radio-frequency reception signal) that has passed through the antenna element 202, the switch 225, and the duplexer 201B, and outputs the amplified signal to the RF signal processing circuit 203.

The power amplifier circuits 234a and 234b are transmission amplifier circuits that amplify a radio-frequency signal (here, a radio-frequency transmission signal) output from the RF signal processing circuit 203, and output the amplified signal to the antenna element 202 via the duplexer 201A and the switch 225. The power amplifier circuits 244a and 244b are transmission amplifier circuits that amplify a radio-frequency signal (here, a radio-frequency transmission signal) output from the RF signal processing circuit 203, and output the amplified signal to the antenna element 202 via the duplexer 201B and the switch 225.

The RF signal processing circuit 203 performs signal processing including down-conversion on a radio-frequency reception signal input from the antenna element 202 via a reception signal path and outputs a reception signal generated as a result of the signal processing. The RF signal processing circuit 203 performs signal processing including up-conversion on an input transmission signal and outputs a radio-frequency transmission signal generated as a result of the signal processing. The RF signal processing circuit 203 is preferably, for example, an RFIC. Note that the communication device may preferably include a BB (baseband) IC. In this case, the BBIC performs signal processing on a reception signal that has been processed by the RFIC. The BBIC performs signal processing on a transmission signal and outputs the processed signal to the RFIC. The reception signal that has been processed by the BBIC and the transmission signal before signal processing by the BBIC are preferably, for example, image signals or audio signals. Note that the radio-frequency front-end circuit 230 may include another circuit element between the above-described elements.

Note that the radio-frequency front-end circuit 230 may include duplexers that are modifications of the duplexers 201A and 201B, instead of the duplexers 201A and 201B.

The filters 231 and 232 in the communication device 240 are connected between the RF signal processing circuit 203 and the switch 225 without the low-noise amplifier circuits 214 and 224 and the power amplifier circuits 234a, 234b, 244a, and 244b interposed therebetween. The filters 231 and 232 are connected to the antenna element 202 with the switch 225 interposed between the antenna element 202 and the filters 231 and 232, similarly to the duplexers 201A and 201B.

The radio-frequency front-end circuit 230 and the communication device 240 include, for example, an elastic wave resonator, a filter, a duplexer, or a multiplexer including three or more filters, which is an elastic wave device according to a preferred embodiment of the present invention, and therefore, breakage or chipping in the piezoelectric substrate is less likely to occur.

The elastic wave devices, the radio-frequency front-end circuits, and the communication devices of the present invention have been described with reference to preferred embodiments and their modifications. However, other preferred embodiments obtained by combining any elements in the above-described preferred embodiments and modifications, modifications obtained by making various modifications conceived by a person skilled in the art to the above-described preferred embodiments without departing from the spirit of the present invention, and various devices that include the radio-frequency front-end circuits and the communication devices according to preferred embodiments of the present invention are included in the present invention.

Preferred embodiments of the present invention may be widely used in communication apparatuses, such as mobile phones, for example, as an elastic wave resonator, a filter, a duplexer, a multiplexer applicable to a multiband system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device manufacturing method comprising:
 a step of providing a plurality of IDT electrodes corresponding to a plurality of elastic wave devices on a first main surface of a piezoelectric wafer, the piezoelectric wafer including the first main surface and a second main surface opposite to each other;
 a step of providing a plurality of support layers that respectively surround the plurality of IDT electrodes on the first main surface of the piezoelectric wafer;
 a step of bonding a cover member to cover the plurality of support layers to obtain a multilayer body;
 a first cutting step of cutting the multilayer body in a first direction a plurality of times; and
 a second cutting step of cutting the multilayer body in a second direction orthogonal or substantially orthogonal to the first direction after the first cutting step to individually obtain the elastic wave devices; wherein
 in a portion in which elastic wave devices of the plurality of elastic wave devices adjacent to each other are present on the first main surface of the piezoelectric wafer, a resin layer is provided to extend across a boundary between the elastic wave devices adjacent to each other;

the second cutting step is performed in a state in which the resin layer is present; and between the first main surface of the piezoelectric wafer and the support layers, a base layer made of a synthetic resin having an elasticity modulus lower than an elasticity modulus of the support layers is provided.

2. The elastic wave device manufacturing method according to claim 1, wherein the second cutting step is performed in a state in which the resin layer that extends over the elastic wave devices adjacent to each other in the first direction is present.

3. The elastic wave device manufacturing method according to claim 1, wherein the support layers are made of a synthetic resin; and the resin layer is made of a synthetic resin identical or substantially identical to the synthetic resin of the support layers.

4. An elastic wave device comprising:

a piezoelectric substrate including a first main surface and a second main surface opposite to each other and having piezoelectricity in at least a portion thereof;

an IDT electrode provided on the first main surface of the piezoelectric substrate;

a support layer provided on the first main surface of the piezoelectric substrate so as to surround the IDT electrode; and a cover member covering the support layer; wherein the support layer is located inward from an outer edge of the first main surface of the piezoelectric substrate;

a resin layer that extends to at least one of a plurality of corner portions of the first main surface of the piezoelectric substrate is provided;

the piezoelectric substrate includes a support substrate, and a piezoelectric layer laminated on the support substrate; and through the support substrate, a bulk wave propagates at an acoustic velocity higher than an acoustic velocity of an elastic wave that propagates through the piezoelectric layer.

5. The elastic wave device manufacturing method according to claim 1, wherein the base layer also extends between the first main surface of the piezoelectric wafer and the resin layer.

6. The elastic wave device manufacturing method according to claim 1, wherein the first cutting step and the second cutting step are performed by cutting with a dicing machine.

7. The elastic wave device manufacturing method according to claim 1, wherein the piezoelectric wafer is a piezoelectric substrate.

8. The elastic wave device manufacturing method according to claim 1, wherein the piezoelectric wafer includes a support substrate and a piezoelectric layer laminated on the support substrate.

9. The elastic wave device manufacturing method according to claim 8, wherein through the support substrate, a bulk wave propagates at an acoustic velocity higher than an acoustic velocity of an elastic wave that propagates through the piezoelectric layer.

10. The elastic wave device manufacturing method according to claim 9, wherein each of the elastic wave devices further includes a low-acoustic-velocity material layer laminated between the support substrate and the piezoelectric layer and made of a low-acoustic-velocity material through which a bulk wave propagates at an acoustic velocity lower than the acoustic velocity of an elastic wave that propagates through the piezoelectric layer.

11. The elastic wave device manufacturing method according to claim 8, wherein each of the elastic wave devices further includes:

a high-acoustic-velocity material layer laminated between the support substrate and the piezoelectric layer and made of a high-acoustic-velocity material through which a bulk wave propagates at an acoustic velocity higher than an acoustic velocity of an elastic wave that propagates through the piezoelectric layer; and a low-acoustic-velocity material layer laminated between the high-acoustic-velocity material layer and the piezoelectric layer and made of a low-acoustic-velocity material through which a bulk wave propagates at an acoustic velocity lower than the acoustic velocity of an elastic wave that propagates through the piezoelectric layer.

12. An elastic wave device comprising:

a piezoelectric substrate including a first main surface and a second main surface opposite to each other and having piezoelectricity in at least a portion thereof;

an IDT electrode provided on the first main surface of the piezoelectric substrate;

a support layer provided on the first main surface of the piezoelectric substrate so as to surround the IDT electrode;

a cover member covering the support layer;

a high-acoustic-velocity material layer laminated between the support substrate and the piezoelectric layer and made of a high-acoustic-velocity material through which a bulk wave propagates at an acoustic velocity higher than an acoustic velocity of an elastic wave that propagates through the piezoelectric layer; and a low-acoustic-velocity material layer laminated between the high-acoustic-velocity material layer and the piezoelectric layer and made of a low-acoustic-velocity material through which a bulk wave propagates at an acoustic velocity lower than the acoustic velocity of an elastic wave that propagates through the piezoelectric layer; wherein the piezoelectric substrate includes a support substrate, and a piezoelectric layer laminated on the support substrate;

the support layer is located inward from an outer edge of the first main surface of the piezoelectric substrate; and a resin layer that extends to at least one of a plurality of corner portions of the first main surface of the piezoelectric substrate is provided.

13. The elastic wave device according to claim 4, wherein the resin layer is connected to the support layer.

14. The elastic wave device according to claim 4, wherein the support layer is made of a synthetic resin, and the resin layer is made of a synthetic resin identical or substantially identical to the synthetic resin of the support layer.

15. The elastic wave device according to claim 4, wherein between the first main surface of the piezoelectric substrate and the support layer, a base layer made of a resin having an elasticity modulus lower than an elasticity modulus of the support layer is provided.

16. The elastic wave device according to claim 15, wherein the base layer also extends between the first main surface of the piezoelectric substrate and the resin layer.

17. A radio-frequency front-end circuit comprising:
the elastic wave device according to claim 4; and
a power amplifier.

18. A communication device comprising:
the radio-frequency front-end circuit according to claim 17; and
an RF signal processing circuit.

19. The leastic wave device according to claim 4, further comprising a low-acoustic-velocity material layer laminated between the support substrate and the piezoelectric layer and made of a low-acoustic-velocity material through which a bulk wave propagates at an acoustic velocity lower than the acoustic velocity of an elastic wave that propagates through the piezoelectric layer.

\* \* \* \* \*